United States Patent [19]

Shimada

[11] Patent Number: 5,157,682
[45] Date of Patent: Oct. 20, 1992

[54] INTEGRATED SEMICONDUCTOR LASER DEVICE

[75] Inventor: Naohiro Shimada, Kawasaki, Japan

[73] Assignee: Kabushiki Kaisha Toshiba, Kawasaki, Japan

[21] Appl. No.: 707,060

[22] Filed: May 29, 1991

[30] Foreign Application Priority Data

May 29, 1990 [JP] Japan .................. 2-139173

[51] Int. Cl.$^5$ ................ H01S 3/19
[52] U.S. Cl. .................. 372/50; 372/23; 372/46
[58] Field of Search ............ 372/50, 46, 23, 44, 372/45

[56] References Cited

U.S. PATENT DOCUMENTS 5,048,040 9/1991 Paoli ................ 372/23

Primary Examiner—James W. Davie
Attorney, Agent, or Firm—Oblon, Spivak, McClelland, Maier & Neustadt

[57] ABSTRACT

A semiconductor laser device for oscillating laser beams having different wavelengths from adjacent regions includes an n-type first cladding layer, a first active layer, a p-type second cladding layer, a p-type first contact layer, a p-type third cladding layer, a second active layer, an n-type fourth cladding layer, and an n-type second contact layer in this order from an n-type substrate. The first and second electrodes are arranged on the first and second contact layers, respectively, and the third electrode is arranged on the lower surface of the substrate. A difference in energy gaps of the second cladding layer and the first contact layer is so large that no current flows across the second cladding layer and the first contact layer, and a difference in energy gaps of the third cladding layer and the first contact layer is so large that no current flows across the third cladding layer and the first contact layer. P-type intermediate energy-gap layers are formed into stripes between the second cladding layer and the first contact layer and between the third cladding layer and the first contact layer, respectively, and current paths are respectively formed through the intermediate energy-gap layers. The two current paths are substantially aligned to each other in a vertical direction.

9 Claims, 5 Drawing Sheets

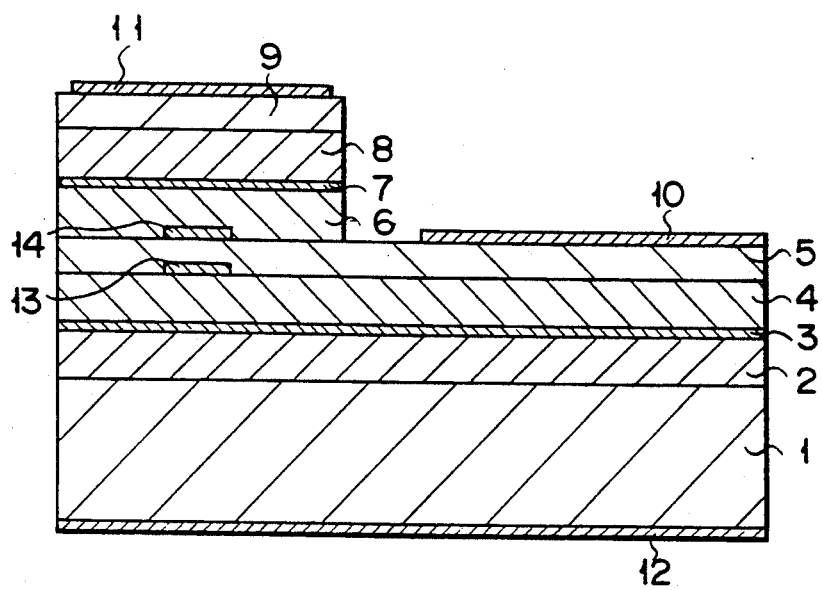
F I G. 2F
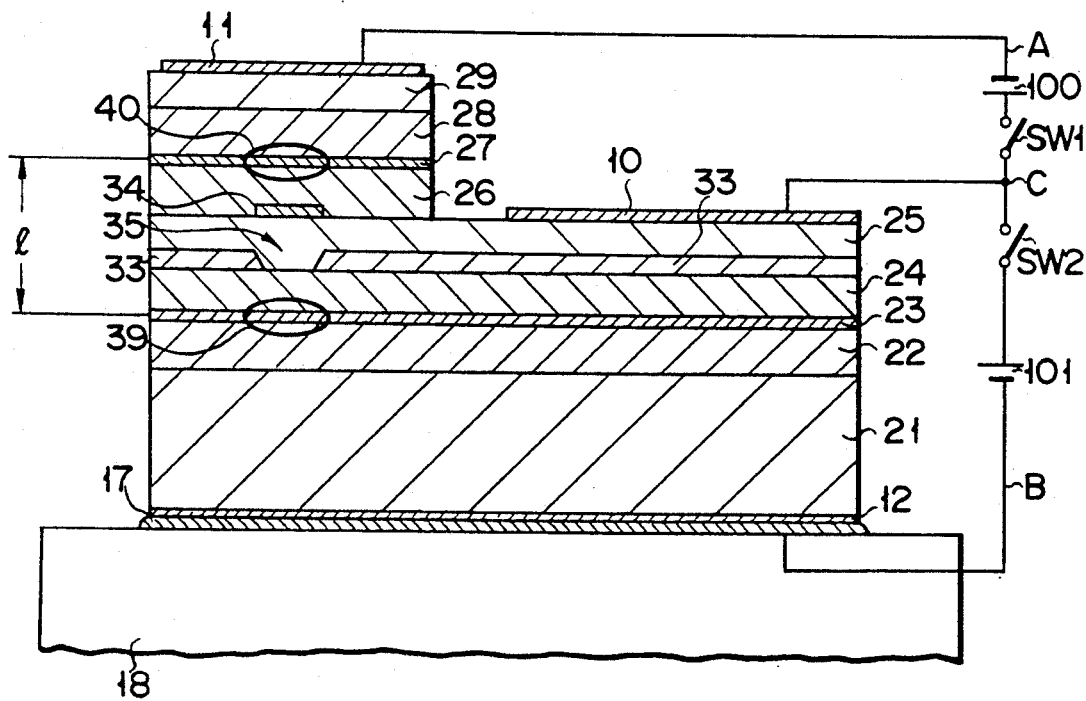
F I G. 3

INTEGRATED SEMICONDUCTOR LASER DEVICE

BACKGROUND OF THE INVENTION

1. Field of the Invention

The present invention relates to an integrated semiconductor laser device and, more particularly, to an integrated semiconductor laser device capable of oscillating a plurality of laser beams.

2. Description of the Related Art

A semiconductor laser device for oscillating laser beams having different wavelengths from relatively adjacent regions has been proposed. A laser device of this type is used in, e.g., an optical head of an optical disk recording apparatus or a light source for optical communication. However, a device in which a difference between the wavelengths of laser beams is several tens nm, several hundreds nm, or more and a short interval between light-emitting points (laser oscillating regions) is about several μm cannot be obtained yet. In the conventional device which is proposed, collimation of oscillated laser beams is not satisfactory.

SUMMARY OF THE INVENTION

It is an object of the present invention to provide a compact integrated semiconductor laser device for oscillating laser beams having satisfactory collimation.

An integrated semiconductor laser device according to the present invention comprises a first cladding layer of a first conductivity type formed on a surface of a substrate of the first conductivity type, a first active layer formed on the first cladding layer, a second cladding layer of a second conductivity type formed on the first active layer, a first contact layer of the second conductivity type formed on the second cladding layer, first electric current confinement means, arranged between the second cladding layer and the first contact layer, for forming a current path only in a selected region between the second cladding layer and the first contact layer, an electrode forming region formed on a surface of the first contact layer, a first electrode formed in the electrode forming region, a third cladding layer of the second conductivity type formed on a part of the first contact layer, second electric current confinement means, arranged between the third cladding layer and the first contact layer, for forming a current path only in a selected region between the third cladding layer and the first contact layer, a second active layer formed on the third cladding layer, a fourth cladding layer of the first conductivity type formed on the second active layer, a second contact layer of the first conductivity type formed on the fourth cladding layer, a second electrode formed on the second contact layer, and a third electrode formed in contact with the substrate.

According to the preferred embodiment of the present invention, the current paths formed by the first and second electrode current confinement means are substantially aligned to each other in a vertical direction.

When a difference between energy gaps of the second cladding layer and the first contact layer and/or a difference between energy gaps of the third cladding layer and the first contact layer are so large that no currents flow across the second cladding layer and the first contact layer and/or across the third cladding layer and the first contact layer, respectively, the first and/or second electric current confinement means are constituted by intermediate energy-gap layers of the second conductivity type, each formed into a stripe shape, between the second cladding layer and the first contact layer and/or between the third cladding layer and the first contact layer, and the current paths are formed through the intermediate energy-gap layers.

When a difference between energy gaps of the second cladding layer and the first contact layer and/or a difference between energy gaps of the third cladding layer and the first contact layer are so small that currents flow across the second cladding layer and the first contact layer and/or across the third cladding layer and the first contact layer, respectively, the first and/or second electric current confinement means are constituted by current blocking layers, each having a stripe-shaped opening, formed between the second cladding layer and the first contact layer and/or between the third cladding layer and the first contact layer, and the current paths are formed through the stripe-shaped openings.

According to the integrated semiconductor laser device of the present invention, when the compositions of the first and second active layers or the compositions of the cladding layers sandwiching these layers are changed, laser beams having wavelengths different from each other by several tens nm, several hundreds nm, or more can be oscillated. An interval between the laser oscillating regions is defined by a value obtained by adding the thicknesses of the two cladding layers between the laser oscillating regions and the thickness of the contact layer together or by adding the sum of these thicknesses to the thickness of the current blocking layer. Therefore, the interval between the laser oscillating regions can be sufficiently decreased, and the compact device can be obtained. In addition, since the semiconductor laser device having the oscillating regions is integrated to be monolithic, collimation of the laser beams can be exactly controlled.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2F are sectional views showing the integrated semiconductor laser device according to the first embodiment of the present invention in order of manufacturing steps;

FIG. 3 is a sectional view showing an integrated semiconductor laser device according to the second embodiment of the present, invention.

DETAILED DESCRIPTION OF THE PREFERRED EMBODIMENTS

Figure 1:
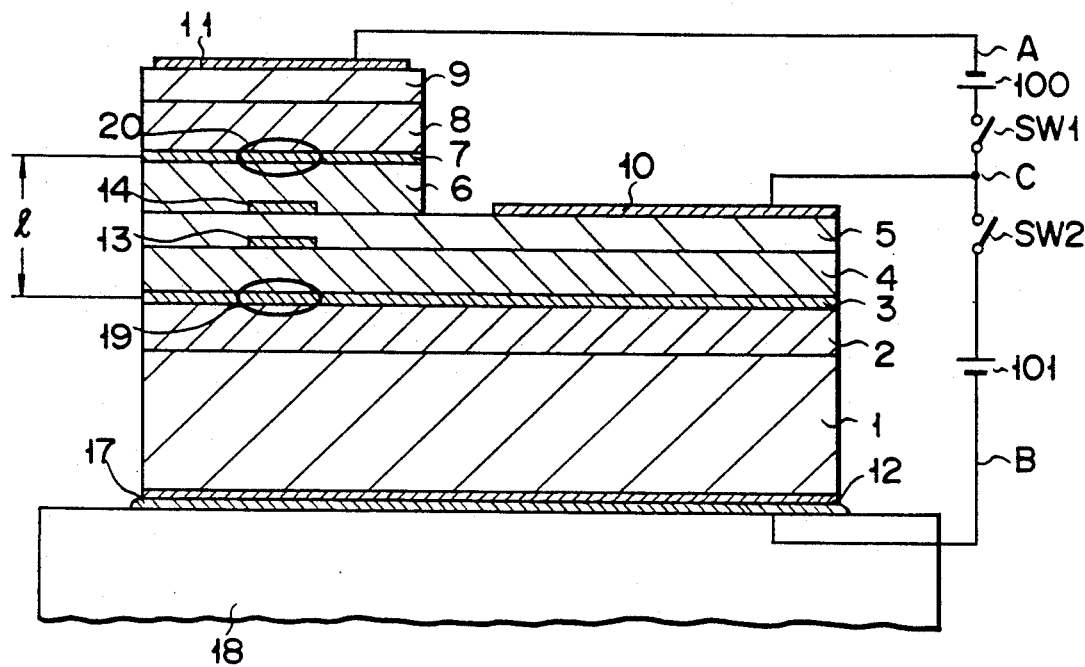
FIG. 1 is a sectional view showing an integrated semiconductor laser device according to the first embodiment of the present invention.

Referring to FIG. 1, a first cladding layer 2 made of n-type $In_{0.5}(Ga_{0.4}Al_{0.6})_{0.5}P$ is formed on an n-type GaAs substrate 1 to have a thickness of about 0.8 μm. A first active layer 3 made of undoped $In_{0.5}(Ga_{0.92}Al_{0.08})_{0.5}P$ is formed on the first cladding layer 2 to have a thickness of about 0.06 μm. A second cladding layer 4 made of p-type $In_{0.5}(Ga_{0.4}Al_{0.6})_{0.5}P$ is formed on the first active layer 3 to have a thickness of about 0.8 μm. A first contact layer 5 made of p-type GaAs is formed on the second cladding layer 4 to have a thickness of about 1.0 μm.

The second cladding layer 4 and the first contact layer 5 have a large difference in energy gaps, and no current flows through a heterojunction portion between these layers. For this reason, a first intermediate energy-gap layer 13 made of p-type $In_{0.5}Ga_{0.5}P$ and formed into a stripe shape is formed between the second cladding layer 4 and the first contact layer 5 to have a thickness of about 0.1 μm. The first intermediate energy-gap layer 13 is formed to obtain a selected current path structure or an electric current confinement structure.

The energy gap of the p-type $In_{0.5}Ga_{0.5}P$ constituting the first intermediate energy-gap layer 13 is larger than that of the p-type GaAs constituting the first contact layer 5 and smaller than that of the p-type $In_{0.5}(Ga_{0.4}Al_{0.6})_{0.5}P$ constituting the second cladding layer 4. That is, the first intermediate energy-gap layer 13 has an energy gap at an intermediate level between the energy gaps of the first contact layer and the second cladding layer 4. Therefore, when the first intermediate energy-gap layer 13 is formed into a stripe shape, the electric current confinement structure can be obtained.

A third cladding layer 6 made of p-type $In_{0.5}(Ga_{0.4}Al_{0.6})_{0.5}P$ is formed on the first contact layer 5 have a thickness of about 0.8 μm. A second intermediate energy-gap layer 14 made of p-type $In_{0.5}Ga_{0.5}P$ is formed between the third cladding layer 6 and the first contact layer 5 to have a thickness of about 0.1 μm. The second intermediate energy-gap layer 14 is formed into a stripe shape to obtain an electric current confinement structure.

The third cladding layer 6, as shown in FIG. 1, is not formed to entirely cover the first contact layer 5, but formed to leave a region where the first contact layer 5 is exposed. This exposed region of the first contact layer 5 is to be an electrode forming region, and, for example, a first electrode 10 made of Ti/Pt/Au is formed thereon.

A second active layer 7 made of undoped $In_{0.5}Ga_{0.5}P$ is formed on the third cladding layer 6 to have a thickness of about 0.06 μm. A fourth cladding layer 8 made of n-type $In_{0.5}(Ga_{0.4}Al_{0.6})_{0.5}P$ is formed on the 0.8 μm. A second contact layer 9 made of n-type GaAs is formed on the fourth cladding layer 8 to have a thickness of about 0.5 μm. A second electrode 11 made of Ti/Pt/Au is formed on the second contact layer 9.

A third electrode 12 made of Ti/Pt/Au is formed on the lower surface of the n-type GaAs substrate 1. In addition, the third electrode 12 on the lower surface of the n-type GaAs substrate 1 has a structure which is mounted on a heat sink 18 by a predetermined mounting member 17.

A method of manufacturing an integrated semiconductor laser device according to the first embodiment will be described below with reference to FIGS. 2A to 2F. The same reference numerals as in FIG. 1 denote the same parts in FIGS. 2A to 2F.

Figure 2A:
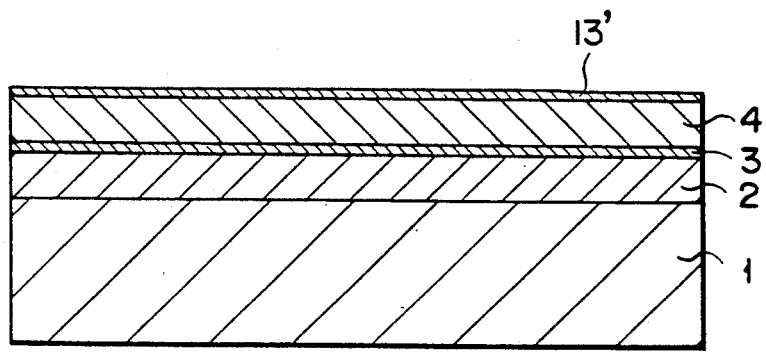

As shown in FIG. 2A, the first cladding layer 2 made of n-type $In_{0.5}(Ga_{0.4}Al_{0.6})_{0.5}P$ is grown on the n-type GaAs substrate 1 by an MOCVD (Metal Organic Chemical Vapor Deposition) method to have a thickness of about 0.8 μm. The first active layer 3 made of undoped $In_{0.5}(Ga_{0.92}Al_{0.08})_{0.5}P$ is grown on the first cladding layer 2 to have a thickness of about 0.06 μm. The second cladding layer 4 made of p-type $In_{0.5}(Ga_{0.4}Al_{0.6})_{0.5}P$ is grown on the active layer 3 by the MOCVD method to have a thickness of about 0.8 μm. A p-type $In_{0.5}Ga_{0.5}P$ layer 13' prospectively serving as the first intermediate energy-gap layer is grown on the cladding layer 4 by the MOCVD method to have a thickness of about 0.1 μm.

Figure 2B:
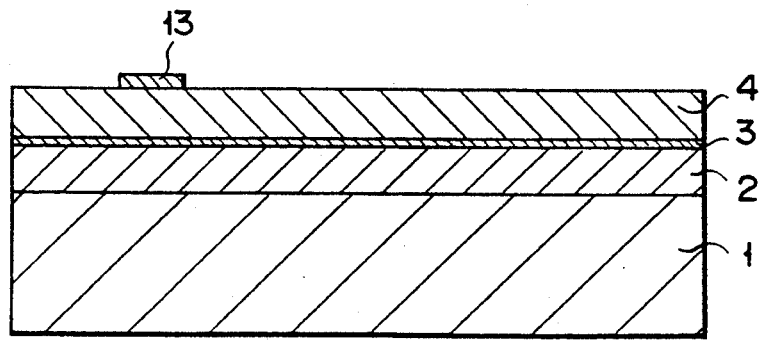

As shown in FIG. 2B, after $SiO_2$ is deposited on the resultant structure by a CVD method, a photoresist is coated on the $SiO_2$ layer. Using a double-layer mask (not shown) formed as described above, the p-type $In_{0.5}Ga_{0.5}P$ layer 13' is etched by a Br (bromine) based etchant. Thus, the p-type $In_{0.5}Ga_{0.5}P$ layer 13' is patterned into the first intermediate band-gap layer 13 having a stripe shape having a width of about 3 μm.

Figure 2C:
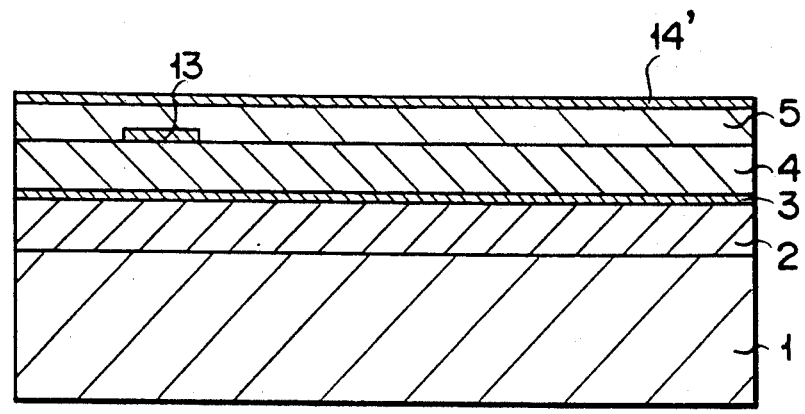

As shown in FIG. 2C, after the double-layer mask (not shown) is removed, the first contact layer 5 made of p-type GaAs is grown on the second cladding layer 4 and the first intermediate energy gap layer 13 by an MOCVD method to have a thickness of about 1.0 μm. A p-type $In_{0.5}Ga_{0.5}P$ layer 14' prospectively serving as the second intermediate energy-gap layer is grown by the MOCVD method to have a thickness of about 0.1 μm.

Figure 2D:
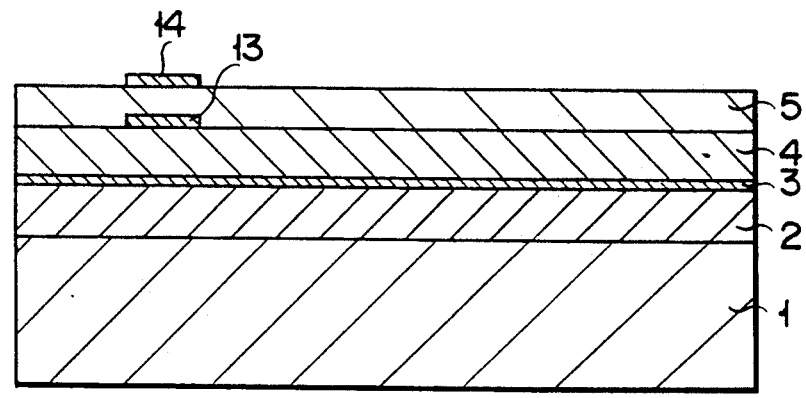

As shown in FIG. 2D, after $SiO_2$ is deposited by the CVD method, a photoresist is coated on the $SiO_2$ layer. Using a double-layer mask (not shown) formed as described above, the p-type $In_{0.5}Ga_{0.5}P$ layer 14' is etched by a Br based etchant. Thus, the p-type $In_{0.5}Ga_{0.5}P$ 14' is patterned into the second intermediate energy-gap layer 14 having a stripe shape having a width of about 3 μm.

Figure 2E:
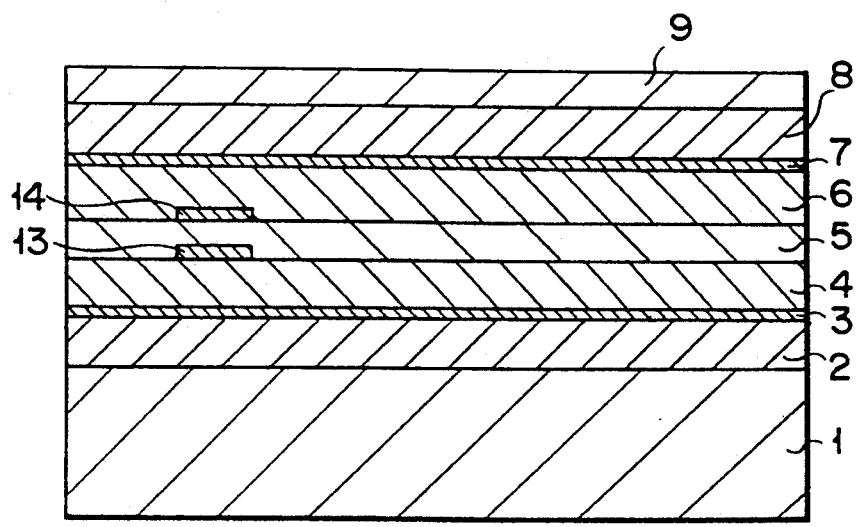

As shown in FIG. 2E, after the double-layer mask (not shown) is removed, the third cladding layer 6 made of p-type $In_{0.5}(Ga_{0.4}Al_{0.6})_{0.5}P$ is grown on the first contact layer 5 and the second intermediate energy-gap layer 14 by the MOCVD method to have a thickness of about 0.8 μm. The second active layer 7 made of undoped $In_{0.5}Ga_{0.5}P$ is grown on the third cladding layer 6 by the MOCVD method to have a thickness of about 0.06 μm. The fourth cladding layer 8 made of n-type $In_{0.5}(Ga_{0.4}Al_{0.6})_{0.5}P$ is formed on the second active layer 7 by the MOCVD method to have a thickness of about 0.8 μm. The second contact layer 9 made of n-type GaAs is grown on the fourth cladding layer 8 by the MOCVD method to have a thickness of about 0.5 μm.

As shown in FIG. 2F, using a double-layer mask (not shown) constituted by, e.g., an $SiO_2$ layer and a photoresist layer, the second contact layer 9, the fourth cladding layer 8, the second active layer 7, and the third cladding layer 6 are partially, sequentially removed so as to expose the surface of the first contact layer 5 while each side of the stripes is left by a width of 50 μm. The first electrode 10 having a width of about 150 μm and made of Ti/Pt/Au is formed by a lift-off method or a deposition method in the region where the surface of the first contact layer 5 is exposed. The second electrode 11 having a width of about 80 μm and made of Ti/Pt/Au is formed on the second contact layer 9 by the lift-off method or the deposition method. The third electrode 12 made of Ti/Pt/Au is formed by the deposition method on the side where the n-type GaAs substrate 1 is exposed. The resultant structure is cleaved into chips each having a resonator length of 250 μm and a width of 300 μm.

The chip manufactured in the above manufacturing method is mounted on the heat sink 18 by the mounting member 17 having a predetermined thermal conductivity, as shown in FIG. 1. Predetermined wire bonding is performed to the first to third electrodes 10, 11, and 12. For example, this wire bonding is performed as described in FIG. 1. That is, a low-potential side A of a first power source 100 is connected to the second electrode 11, a low-potential side B of a second power source 101 is connected to the third electrode 12, and a common high-potential node C of the first and second power sources 100 and 101 is connected to the first electrode 10. In addition, when a switch SW1 is arranged between the common high-potential node C and the first power source 100 and a switch SW2 is arranged between the common high-potential node C and the second power source 101, laser beams are independently or simultaneously oscillated from first and second oscillation regions 19 and 20 shown in FIG. 1. As described above, the integrated semiconductor laser device according to the first embodiment is completed.

According to the integrated semiconductor laser device according to the first embodiment, when the switches SW1 and SW2 are simultaneously turned on, laser beams can be respectively oscillated from the first and second active layers 3 and 7. A laser beam having an oscillation threshold value of 80 mA and a wavelength of 630 nm is oscillated from the oscillation region 19 of the first active layer 3, and a laser beam having an oscillation threshold value of 60 mA and a wavelength of 670 nm is oscillated from the oscillation region 20 of the second active layer 7. In this embodiment, the interval 1 between these laser beams, i.e., between the first oscillation region 19 and the second oscillation region 20 is defined by thicknesses of the second cladding layer 4, the first contact layer 5, and the third cladding layer 6. As described in the above embodiment, these thicknesses are 0.8 μm, 1.0 μm, and 0.8 μm, respectively. Even when the values are summed up, the interval 1 is 3 μm or less. This interval is satisfactory to focus the beams by a single lens. The compact laser device having a resonator length of 250 μm and a width of 300 μm can be obtained. Since the two laser oscillating structures are integrated to be monolithic, collimation of the beams is satisfactory, and a conventional mounting method can be used in this embodiment. In addition, a conventional mounting member can be used as the mounting member 17.

The compositions of the first and second active layers and the compositions of the first to fourth cladding layers are not limited to the compositions described in the above embodiment. These compositions can be variously changed, and various combinations of active layers and cladding layers can be obtained. When at least one of the first and second active layers 3 and 7 has a composition of $Ga_{1-x}Al_xAs$, a laser beam having a wavelength of 700 to 800 nm can be oscillated. In addition, the conductivity types of the layers in the above embodiment may be inverted. The efficiency of beam extraction can be changed by adjusting precision of end face coating.

In the above embodiment, the first and second intermediate energy-gap layers 13 and 14 have a composition of $In_{0.5}Ga_{0.5}P$. This composition can be changed into, e.g., a composition of $In_{1-y}(Ga_{1-c}Al_c)_yP$ for $0 \leq c \leq 0.1$.

The interval 1 between the beams can be exactly controlled by changing the thicknesses of the cladding layers and the contact layers when the crystal of these layers is grown.

In the first embodiment, a two-wavelength integrated semiconductor laser device has been described. However, when another stripe structure is stacked on the device using the methods of stacking the layers and extracting the electrodes according to the present invention, an integrated semiconductor laser device capable of oscillating three or more laser beams having different wavelengths can be provided.

When the layers have the same composition, an integrated semiconductor laser device in which a plurality of laser beams even having the same wavelength can be oscillated and an interval between the laser beams is several μm or less can be obtained.

An integrated semiconductor laser device according to the second embodiment of the present invention will be described below with reference to FIGS. 3 and 4A to 4F.

Referring to FIG. 3, a first cladding layer 22 made of n-type $G_{0.6}Al_{0.4}As$ is formed on an n-type GaAs substrate 21 to have a thickness of about 1.5 μm. A first active layer 23 made of undoped $G_{0.94}Al_{0.06}As$ is formed on the first cladding layer 22 to have a thickness of about 0.06 μm. A second cladding layer 24 made of p-type $G_{0.6}Al_{0.4}As$ is formed on the first active layer 23 to have a thickness of about 1.5 μm.

A current blocking layer 33 made of n-type GaAl is formed on the second cladding layer 24. A stripe-shaped opening 35 having a width of 2 μm is formed in the current blocking layer 33, thereby obtaining a electric current confinement structure. The current blocking layer 33 may be constituted by n-type $Ga_{1-b}Al_bAs$.

A first contact layer 25 made of p-type GaAs is formed on the current blocking layer 33 to have a thickness of about 1.5 μm. A third cladding layer 26 made of p-type $In_{0.5}(Ga_{0.4}Al_{0.6})_{0.5}P$ is formed on the first contact layer 25 to have a thickness of about 0.8 μm. An intermediate energy-gap layer 34 made of p-type $In_{0.5}Ga_{0.5}P$ is formed between the third cladding layer 26 and the first contact layer 25 to have a thickness of about 0.1 μm. The intermediate energy-gap layer 34 is formed into a stripe shape to obtain an electric current confinement structure.

The third cladding layer 26, as shown in FIG. 3, is not formed to entirely cover the first contact layer 25 but formed to leave a region where the first contact layer 25 is exposed. The region where the first contact layer 25 is exposed is to be an electrode forming region, and a first electrode 10 made of Ti/Pt/Au is formed therein.

A second active layer 27 made of undoped $In_{0.5}Ga_{0.5}P$ is formed on the third cladding layer 26 to have a thickness of about 0.06 μm. A fourth cladding layer 28 made of n-type $In_{0.5}(Ga_{0.4}Al_{0.6})_{0.5}P$ is formed on the second active layer 27 to have a thickness of about 0.8 μm. A second contact layer 29 made of n-type GaAs is formed on the fourth cladding layer 28 to have a thickness of about 0.5 μm. A second electrode 11 made of Ti/Pt/Au is formed on the second contact layer 29.

A third electrode 12 made of Ti/Pt/Au is formed on the n-type GaAs substrate 21. The n-type GaAs substrate 1 has a structure which is mounted on a heat sink 18 by a predetermined mounting member 17.

Figure 4A:
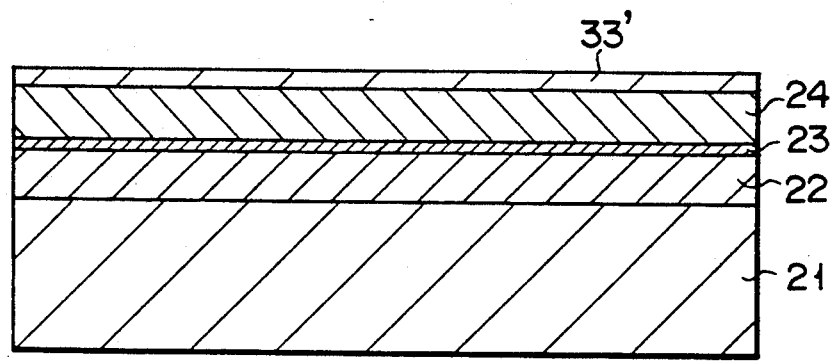
FIGS. 4A to 4F are sectional views showing the integrated semiconductor laser device according to the second embodiment of the present invention in order of manufacturing steps.

A method of manufacturing the integrated semiconductor laser device according to the second embodiment will be described below with reference to FIGS. 4A to 4F. The same reference numerals as in FIG. 3 denote the same parts in FIGS. 4A to 4F As shown in FIG. 4A, the first cladding layer 22 made of n-type $Ga_{0.6}Al_{0.4}As$ is grown on the n-type GaAs substrate 21 by an MOCVD (Metal Organic Chemical Vapor Deposition) method to have a thickness of about 1.5 μm. The first active layer 23 made of undoped $Ga_{0.94}Al_{0.06}As$ is grown on the cladding layer 22 by the MOCVD method to have a thickness of about 0.06 μm. The second cladding layer 24 made of p-type $Ga_{0.6}Al_{0.4}As$ is grown on the first active layer 23 by the MOCVD method to have a thickness of about 1.5 μm. An n-type GaAs layer 33' prospectively serving as a current blocking layer is grown on the second cladding layer 24 by the MOCVD method to have a thickness of about 0.5 μm.

Figure 4B:
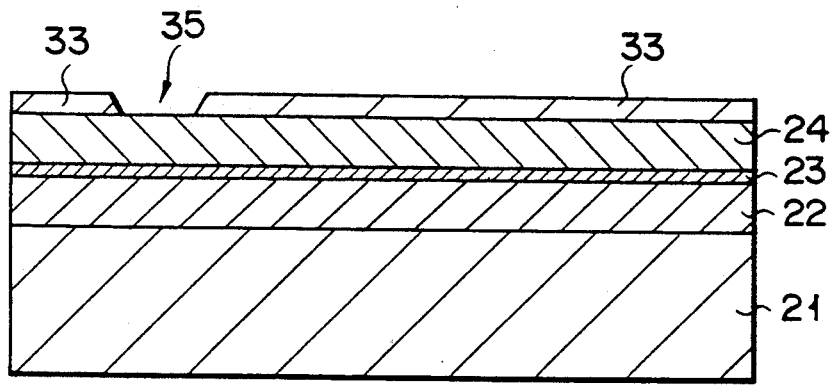

As shown in FIG. 4B, the stripe-shaped opening 35 having a width of about 2 μm is formed in the n-type GaAs layer 33' by a photolithography method using a photoresist, thereby forming the current blocking layer 33.

Figure 4C:
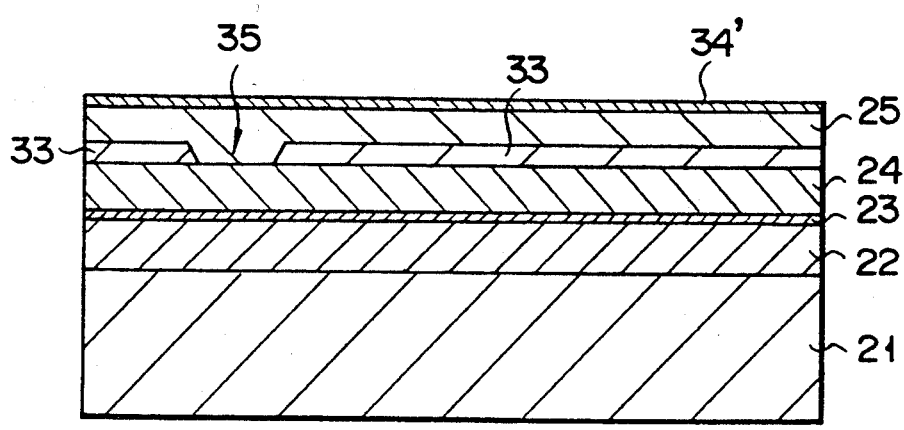

As shown in FIG. 4C, the first contact layer 25 made of p-type GaAs and having a thickness of about 1.5 μm is grown by the MOCVD method on the current blocking layer 33 including the opening 35. A p-type $In_{0.5}Ga_{0.5}P$ layer 34' prospectively serving as an intermediate energy-gap layer is grown by the MOCVD method to have a thickness of about 0.1 μm.

Figure 4D:
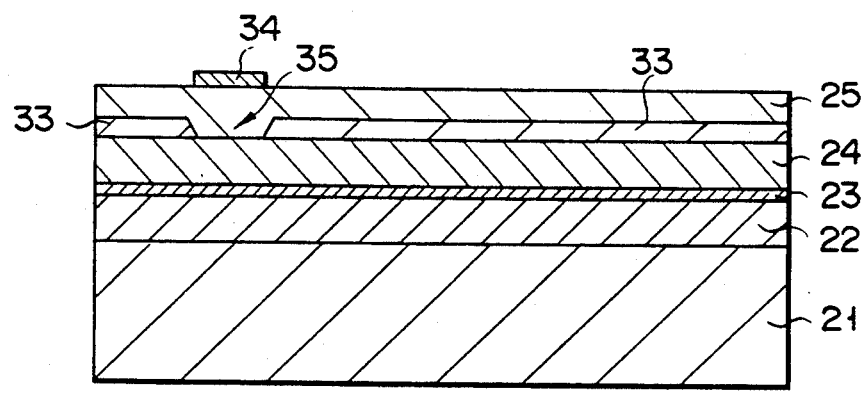

As shown in FIG. 4D, after $SiO_2$ is deposited by the CVD method, a photoresist is coated on the $SiO_2$ layer. Using a double-layer mask (not shown) formed as described above, the p-type $In_{0.5}Ga_{0.5}P$ layer 34' is etched by a Br based etchant. Thus, the p-type $In_{0.5}Ga_{0.5}P$ layer 34' is patterned into the second intermediate energy-gap layer 34 having a stripe shape having a width of about 3 μm.

Figure 4E:
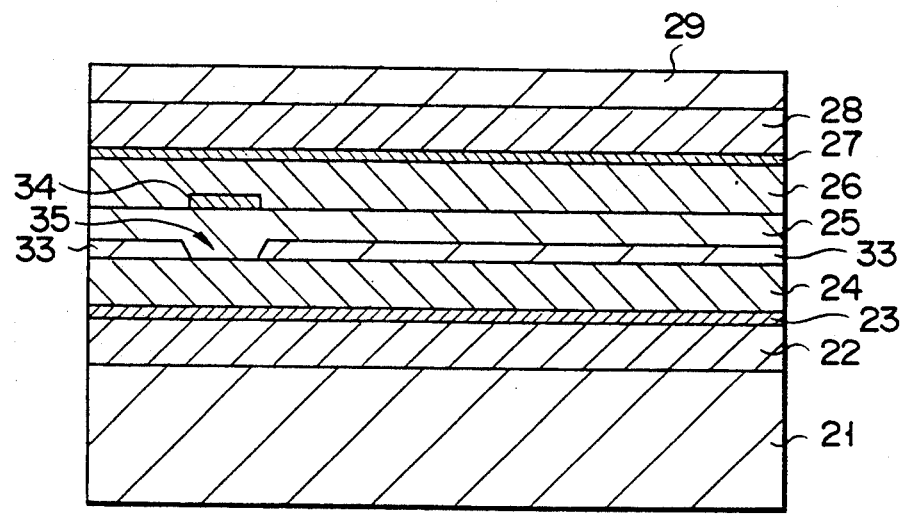

As shown in FIG. 4E, after the double-layer mask (not shown) is removed, the third cladding layer 26 made of p-type $In_{0.5}(Ga_{0.4}Al_{0.6})_{0.5}P$ is grown on the first contact layer 25 and the second intermediate energy-gap layer 34 by the MOCVD method to have a thickness of about 0.8 μm. The second active layer 27 made of undoped $In_{0.5}Ga_{0.5}P$ is grown on the third cladding layer 26 by the MOCVD method to have a thickness of about 0.06 μm. The fourth cladding layer 28 made of n-type $In_{0.5}(Ga_{0.4}Al_{0.6})_{0.5}P$ is grown on the second active layer 27 by the MOCVD method to ave a thickness of about 0.8 μm. The second contact layer 29 made of n-type GaAs is grown on the fourth cladding layer 28 by the MOCVD method to have a thickness of about 0.5 μm.

Figure 4F:
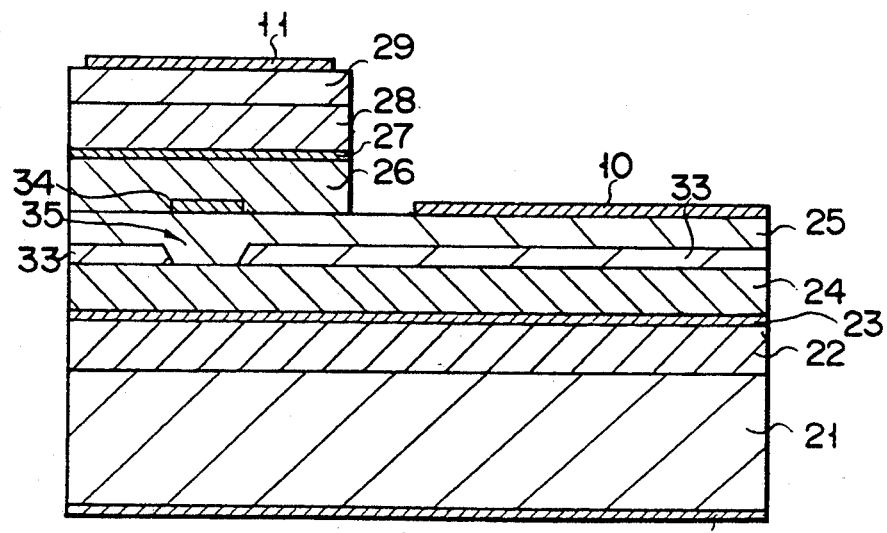

As shown in FIG. 4F, using a double-layer mask (not shown) constituted by, e.g., an $SiO_2$ layer and a photoresist layer, the second contact layer 29, the fourth cladding layer 28, the second active layer 27, and the third cladding layer 26 are selectively, sequentially removed so as to expose the surface of the first contact layer 25 while each side of the stripes is left by a width of 50 μm. The first electrode 10 having a width of about 150 μm and made of Ti/Pt/Au is formed by a lift-off method or a deposition method in a region where the surface of the first contact layer 25 is exposed. The second electrode 11 having a width of about 80 μm and made of Ti/Pt/Au is formed by the lift-off method or the deposition method on the second contact layer 29. The third electrode 12 made of Ti/Pt/Au is formed by the deposition method on the side where the n-type GaAs substrate 21 is exposed. The resultant structure is cleaved into chips each having a resonator length of 250 μm and a width of 300 μm.

The chip manufactured in the above manufacturing method is mounted on the heat sink 18 by a predetermined mounting member 17, as shown in FIG. 3. Predetermined wire bonding is performed to the first to third electrodes 10, 11, and 12. For example, this wire bonding is performed as described in FIG. 3. That is, a low-potential side A of a first power source 100 is connected to the second electrode 11, a low-potential side B of a second power source 101 is connected to the third electrode 12, and a common high-potential node C of the first and second power sources 100 and 101 is connected to the first electrode 10. In addition, when a switch SW1 is arranged between the common high-potential node C and the first power source 100 and a switch SW2 is arranged between the common high-potential node C and the second power source 101, laser beams are independently or simultaneously oscillated from first and second oscillation regions 39 and 40 shown in FIG. 3. As described above, the integrated semiconductor laser device according to the second embodiment is completed.

According to the integrated semiconductor laser device according to the second embodiment, when the switches SW1 and SW2 are simultaneously turned on, laser beams can be respectively oscillated from the first and second active layers 23 and 27. A laser beam having an oscillation threshold value of 40 mA and a wavelength of 830 nm is oscillated from the oscillation region 39 of the first active layer 23, and a laser beam having an oscillation threshold value of 70 mA and a wavelength of 670 nm is oscillated from the oscillation region 40 of the second active layer 27. In this embodiment, the interval l between these laser beams, i.e., between the first oscillation region 39 and the second oscillation region 40 is defined by thicknesses of the second cladding layer 24, the first contact layer 25, the third cladding layer 26, and the current blocking layer 33. As described in the above embodiment, these thicknesses are 1.5 μm, 1.5 μm, 0.8 μm, and 0.5 μm, respectively. Even when these values are summed up, the interval l is about 4.3 μm. This interval is satisfactory to focus the beams by a single lens. The compact laser device having a resonator length of 250 μm and a width of 300 μm can be obtained. Since the two laser oscillating structures are integrated to be monolithic, collimation of the beams is satisfactory, and a conventional mounting method can be used in this embodiment. In addition, a conventional mounting member can be used as the mounting member 17.

The compositions of the first and second active layers and the compositions of the first to fourth cladding layers are not limited to the compositions described in the above embodiment. These compositions can be variously changed, and various combinations of active layers and cladding layers can be obtained.

As a feature of the second embodiment, a material having an energy gap slightly different from that of the material constituting the first contact layer 25 ca be used as the material for constituting the cladding layer which is formed in contact with the first contact layer 25. For this feature, a laser beam selectively has a wavelength and characteristics. For example, in the above embodiment, the first contact layer 25 is constituted by GaAs, the cladding layer 24 which is formed in contact with the contact layer 25 is constituted by GaAlAs, and the cladding layer 26 which is formed in contact with the contact layer 25 is constituted by InGaAlP. In this case, the GaAs and the InGaAlP have a large difference in energy gaps, and no current flows through the heterojunction portion between these materials. However, since GaAs and GAAlAs have a small difference in energy gaps, a current flows through the heterojunction portion between these materials. Therefore, the current blocking layer 33 is provided for the latter having the small difference in energy gaps to obtain an electric current confinement structure, and the intermediate energy-gap layer 34 is provided for the former having the large difference in energy gaps to obtain an electric current confinement structure.

Thus, an integrated semiconductor device having a structure in which a cladding layer constituted by a material having a large difference in energy gaps and a cladding layer constituted by a material having a small difference in energy gaps are arranged on one surface of a contact layer and the other surface of the contact layer, respectively, can be obtained.

As in the first embodiment, the conductivity types of the layers described in the second embodiment may be inverted, and efficiency of laser beam extraction can be changed by adjusting precision of end face coating.

As in the first embodiment, although the intermediate energy-gap layer 34 has a composition of $In_{0.5}Ga_{0.5}P$, the composition can be changed into, e.g., a composition of $In_{1-y}(Ga_{1-c}Al_c)_yP$ for $0 \leq c \leq 0.1$.

As in the first embodiment, the interval l between the beams can be exactly controlled by changing the thicknesses of the cladding layers and the contact layers when the crystal of these layers is grown.

In the second embodiment, a two-wavelength integrated semiconductor laser device has bee described. However, when stripe structures are stacked on the device using the methods of stacking the layers and extracting the electrodes according to the present invention, an integrated semiconductor laser device capable of oscillating three or more laser beams having different wavelengths can be provided.

In the cladding layers formed in contact with both the sides of the first contact layer 25, when the cladding layers are constituted by a material having a small energy gap, the current blocking layers 33 shown in FIG. 3 are respectively formed in contact with the cladding layers as a means for obtaining an electric current confinement structure.

In the first and second embodiments, although one of the contact layers is commonly used for the two laser oscillation regions, contact layers may be respectively formed in conjunction with each of the laser oscillation regions.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An integrated semiconductor laser device comprising:

a first cladding layer of a first conductivity type formed on a surface of a substrate of the first conductivity type;

first active layer formed on said first cladding layer;

a second cladding layer of a second conductivity type formed on said first active layer;

a first contact layer of the second conductivity type formed on said second cladding layer;

first electric current confinement means, arranged between said second cladding layer and said first contact layer, for forming a first current path only in a selected region between said second cladding layer and said first contact layer;

an electrode forming region formed on a surface of said first contact layer;

a first electrode formed in said electrode forming region;

a third cladding layer of the second conductivity type formed on a part of said first contact layer;

second electric current confinement means, arranged between said third cladding layer and said first contact layer, for forming a second current path only in a selected region between said third cladding layer and said first contact layer;

a second active layer formed on said third cladding layer;

a fourth cladding layer of the first conductivity type formed on said second active layer;

a second contact layer of the first conductivity type formed on said fourth cladding layer;

a second electrode formed on said second contact layer; and a third electrode formed in contact with said substrate, wherein said first cladding layer, said first active layer, and said second cladding layer together form a first resonant cavity region located below said first current path, and said third cladding layer, said second active layer, and said fourth cladding layer together form a second resonant cavity region located above said second current path.

2. A device according to claim 1, wherein said current paths formed by said first and second electrode current confinement means are substantially aligned to each other in a vertical direction.

3. A device according to claim 2, wherein a difference in energy gaps of said second cladding layer and said first contact layer is so large that no current flows across said second cladding layer and said first contact layer, said first electric current confinement means is constituted by an intermediate energy-gap layer of a second conductivity type formed into a stripe shape between said second cladding layer and said first contact layer and having a energy gap smaller than that of said second cladding layer and larger than that of said first contact layer, and said first current path is formed through said intermediate energy-gap layer.

4. A device according to claim 2, wherein a difference in energy gaps of said third cladding layer and said first contact layer is so large that no current flows across said third cladding layer and said first contact layer, said second electric current confinement means is constituted by an intermediate energy-gap layer of a second conductivity type formed into a stripe shape between said third cladding layer and said first contact layer and having a energy gap smaller than that of said third cladding layer and larger than that of said first contact layer, and said second current path is formed through said intermediate energy-gap layer.

5. A device according to claim 2, wherein a difference in energy gaps of said second cladding layer and said first contact layer is so small that a current flows across said second cladding layer and said first contact layer, said first electric current confinement means is constituted by a current blocking layer formed between second cladding layer and said first contact layer and having a stripe-shaped opening, and said current path is formed through said opening.

6. A device according to claim 2, wherein a difference in energy gaps of said third cladding layer and said first contact layer is so small that a current flows across said third cladding layer and said first contact layer, said second electric current confinement means is constituted by a current blocking layer formed between third cladding layer and said first contact layer and having a stripe-shaped opening, and said second current path is formed through said opening.

7. An integrated semiconductor laser device comprising:
   a first cladding layer of a first conductivity type formed on a surface of a substrate of the first conductivity type;
   a first active layer formed on said first cladding layer;
   a second cladding layer of a second conductivity type formed on said first active layer;
   a first contact layer of the second conductivity type formed on said second cladding layer;
   first electric current confinement means, arranged between said second cladding layer and said first contact layer, for forming a first current path only in a selected region between said second cladding layer and said first contact layer;
   an electrode forming region formed on a surface of said first contact layer;
   a first electrode formed in said electrode forming region;
   a third cladding layer of the second conductivity type formed on a part of said first contact layer, a difference in energy gaps of said third cladding layer and said first contact layer being so large that no current flows across said third cladding layer and said first contact layer;
   second electric current confinement means, arranged between said third cladding layer and said first contact layer, for forming a second current path only in a selected region between said third cladding layer and said first contact layer, said second electric current confinement means being constituted by an intermediate energy-gap layer of the second conductivity type formed into a stripe shape between said third cladding layer and said first contact layer and having an energy gap smaller than that of said third cladding layer and larger than that of said first contact layer, said second current path being formed through said intermediate energy-gap layer, and said current path formed by said second electric current confinement means and said first current path formed by said first electric current confinement means being substantially aligned to each other in a vertical direction;
   a second active layer formed on said third cladding layer;
   a fourth cladding layer of the first conductivity type formed on said second active layer;
   a second contact layer of the first conductivity type formed on said fourth cladding layer;
   a second electrode formed on said second contact layer; and
   wherein said first cladding layer, said first active layer, and said second cladding layer together form a first resonant cavity region located below said first current path, and said third cladding layer, said second active layer, and said fourth cladding layer together form a second resonant cavity region located above said second current path.

8. A device according to claim 7, wherein a difference in energy gaps of said second cladding layer and said first contact layer is so large that no current flows across said second cladding layer and said first contact layer, said first electric current confinement means is constituted by an intermediate energy-gap layer of a second conductivity type formed into a stripe shape between said second cladding layer and said first contact layer and having a energy gap smaller than that of said second cladding layer and larger than that of said first contact layer, and said first current path is formed through said intermediate energy-gap layer between said second cladding layer and said first contact layer.

9. A device according to claim 7, wherein a difference in energy gaps of said second cladding layer and said first contact layer is so small that a current flows across said second cladding layer and said first contact layer, said first electric current confinement means is constituted by a current blocking layer formed between second cladding layer and said first contact layer and having a stripe-shaped opening, and said first current path is formed in said opening between said second cladding layer and said first contact layer.

* * * * *